(12) United States Patent
Celii et al.

(10) Patent No.: US 7,250,349 B2
(45) Date of Patent: Jul. 31, 2007

(54) METHOD FOR FORMING FERROELECTRIC MEMORY CAPACITOR

(75) Inventors: Francis G. Celii, Dallas, TX (US); Mahesh J. Thakre, Dallas, TX (US); Scott R. Summerfelt, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 242 days.

(21) Appl. No.: 10/610,498

(22) Filed: Jun. 30, 2003

(65) Prior Publication Data

US 2004/0175954 A1 Sep. 9, 2004

Related U.S. Application Data

(60) Provisional application No. 60/452,437, filed on Mar. 6, 2003.

(51) Int. Cl.
  *H01L 21/22* (2006.01)
  *H01L 21/461* (2006.01)
  *H01L 21/302* (2006.01)

(52) U.S. Cl. ............... 438/396; 438/710; 438/714; 438/718; 438/720

(58) Field of Classification Search ............ None
See application file for complete search history.

(56) References Cited

U.S. PATENT DOCUMENTS

| 6,057,081 | A  | * | 5/2000  | Yunogami et al. ......... 430/313 |
| 6,143,191 | A  |   | 11/2000 | Baum et al. |
| 6,211,035 | B1 | * | 4/2001  | Moise et al. ............... 438/396 |
| 6,492,222 | B1 | * | 12/2002 | Xing .......................... 438/240 |
| 6,500,678 | B1 | * | 12/2002 | Aggarwal et al. ............ 438/3 |
| 2001/0044205 | A1 |   | 11/2001 | Gilbert et al. |
| 2003/0176073 | A1 | * | 9/2003  | Ying et al. ................. 438/710 |
| 2005/0054122 | A1 | * | 3/2005  | Celii et al. .................... 438/3 |

\* cited by examiner

*Primary Examiner*—Duy-Vu N. Deo
(74) *Attorney, Agent, or Firm*—Peter K. McLarty; W. James Brady, III; Frederick J. Telecky, Jr.

(57) ABSTRACT

A ferroelectric memory capacitor is formed by forming a barrier layer, a first metal layer, a ferroelectric layer, a second metal layer, and a hard mask layer, on dielectric layer (70). Using the patterned hard mask layer (255), the layers are etched to form an etched barrier layer (205), and etched first metal layer (215), and etched ferroelectric layer (225), and etched second metal layers (235, 245). The etched layers form a ferroelectric memory capacitor (270) with sidewalls that form an angle with the plane of the upper surface of the dielectric layer (70) between 78° and 88°. The processes used to etch the layers are plasma processes performed at temperatures between 200° C. and 500° C.

12 Claims, 2 Drawing Sheets

METHOD FOR FORMING FERROELECTRIC MEMORY CAPACITOR

CROSS-REFERENCE TO RELATED PATENT/PATENT APPLICATIONS

This application claims priority under 35 USC § 119(e)(1) of provisional application Ser. No. 60/452,437, filed Mar. 6, 2003.

The following commonly assigned patent/patent applications are hereby incorporated herein by reference:

| Patent No./Ser. No. | Filing Date |
|---|---|
| 6,444,542 | Apr. 3, 2001 |
| 6,548,343 | Oct. 31, 2000 |

FIELD OF THE INVENTION

This invention relates generally to the field of electronic devices and more particularly to a method for forming a ferroelectric memory capacitor for integrated circuit applications

BACKGROUND OF THE INVENTION

High density integrated circuit memories have density dominated by cell size; thus alternative capacitor dielectrics such as high dielectric constant para-electrics for dynamic memory (DRAM) and ferroelectrics for nonvolatile ferroelectric memory (FeRAM) have received intense investigation. The para-electrics currently being investigated barium strontium titanate (BST) and tantalum pentoxide and the ferro electrics include strontium bismuth tantalite (SBT) and lead zirconate titanate (PZT).

Currently there is a need to increase the packing density and reliability of ferroelectric memory integrated circuits. A cross-section of a portion of a typical ferroelectric memory cell is shown in FIG. 1. In a typical 1T-1C ferroelectric memory cell a ferroelectric memory capacitor is connected to a bit line through a MOS transistor. Shown in FIG. 1 is the memory capacitor 160 and MOS transistor from such a 1T-1C memory cell. The MOS transistor comprises a gate dielectric layer 30 on a semiconductor 10. A gate electrode layer 40 is formed on the gate dielectric layer 30 and dielectric sidewall structures 50 are formed adjacent to the gate structure 40. Source and drain regions 60 are formed in the semiconductor 10 adjacent the gate layer 40. Isolation structures 20 are formed in the semiconductor 10 and can comprise shallow trench isolation (STI) similar to that shown in FIG. 1. Following the formation of the MOS transistor, a dielectric layer 70 is formed over the MOS transistor.

In fabricating the ferroelectric capacitor 160 portion of the memory cell, a metal contact 80 (usually comprising tungsten) is formed in the dielectric layer 70. The metal contact 70 provides an electrically conductive path connecting the drain/source 60 of the MOS transistor to one of the plates of the ferroelectric capacitor 160. Following the formation of the metal contact 80, layers of titanium aluminum nitride (TiAlN) 90, iridium (Ir) 100, lead zirconate titanate (PZT) 110, iridium (Ir) 120, and titanium aluminum nitride (TiAlN) 130 are formed and patterned resulting in the ferroelectric capacitor 160. A dielectric layer 140 can then be formed over the capacitor structure and a metal contact 150 provided to connect to the other capacitor plate. In the structure shown in FIG. 1, the PZT layer 110 functions as the capacitor ferroelectric layer and the Ir layers 100 and 120 both function as plates for the capacitor. The TiAlN layers 90 and 130 function as barrier layers. In patterning the various layers to form the ferroelectric capacitor 160, plasma etch process are used to etch the various layers. The plasma etch processes currently in use result in the 68° to 73° tapered ferroelectric capacitor profile shown in FIG. 1. The tapered capacitor profiles limit the packing density of the circuits that are formed using tapered ferroelectric capacitors. In addition the resulting leakage current through the ferroelectric capacitor is higher than desirable due to electrical shorts formed during the etching process. There is therefore a need for an improved method to form ferroelectric capacitors. The instant invention addresses this need.

SUMMARY OF THE INVENTION

A method is described to form ferroelectric memory cells comprising a ferroelectric capacitor. The ferroelectric capacitor is formed by first forming a barrier layer, a first metal layer, a ferroelectric layer, a second metal layer, and a hardmask layer on a dielectric layer. After patterning the hard mask layer, the patterned hard mask layer is used an etch mask to etch the remaining layers using plasma processes at temperatures between 200° C. and 500° C. The plasma etch process is a three step process comprising a first step that comprises the gases $Cl_2$, $O_2$, $N_2$, and CO that is used to etch the first metal layer. The second step comprises the gases $BCl_3$ and $Cl_2$ in ratios from 1:4 to 6:1 respectively, used to etch the ferroelectric layer. The third step comprises the gases $Cl_2$, $O_2$, $N_2$, and CO and is used to etch the second metal layer. The resulting ferroelectric memory capacitor has sidewalls that form an angle with the plane of the upper surface of the dielectric layer of between 78° and 88°.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

Figure 2A:
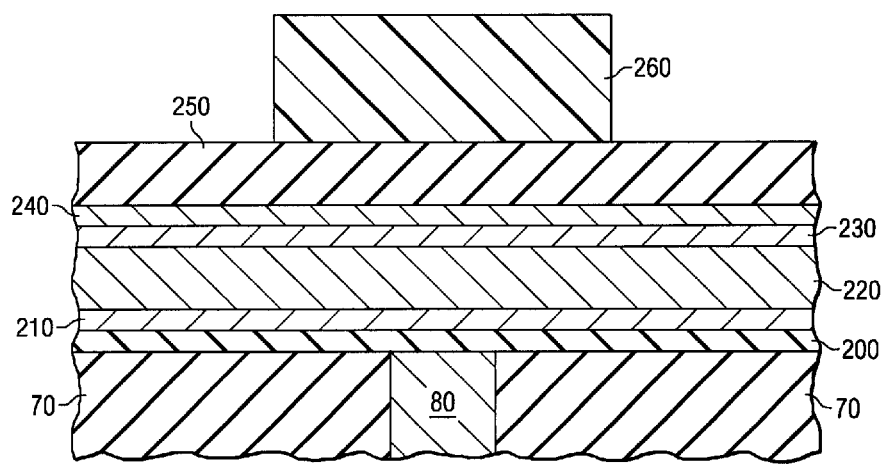
FIGS. 2(a) to FIG. 2(c) are cross-sectional diagrams showing an embodiment of the instant invention.
Figure 2B:
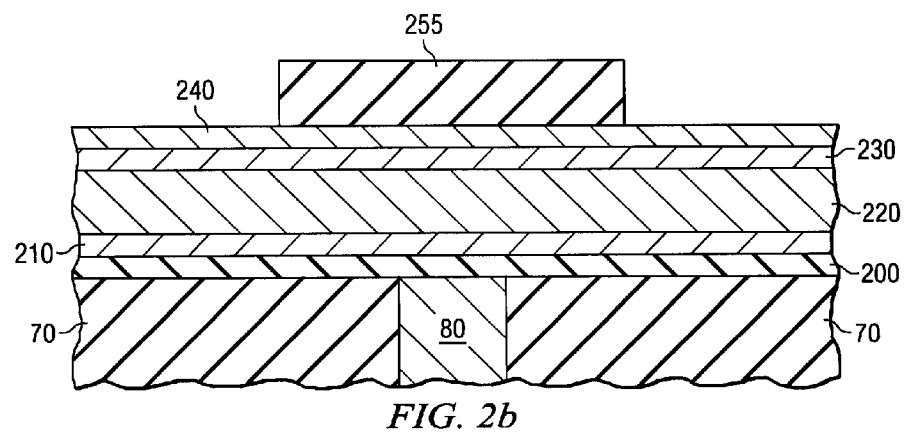
Figure 2C:
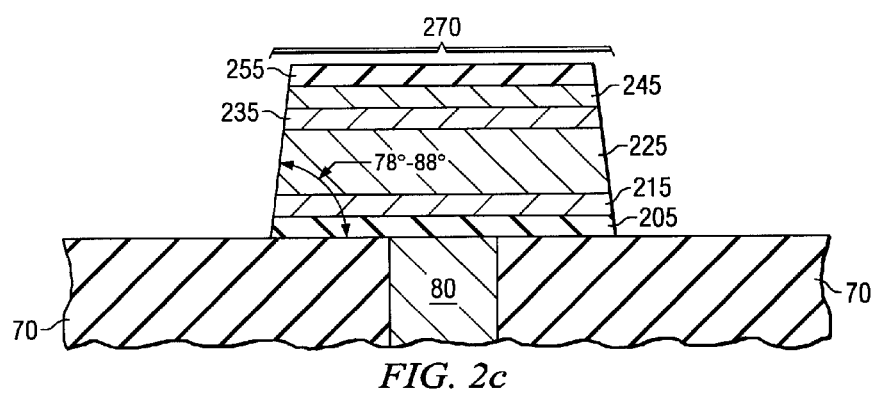

FIG. 2(a) through FIG. 2(c) illustrate the fabrication of a ferroelectric memory capacitor according to an embodiment of the instant invention.

As shown in FIG. 2(a), a metal contact 80 is formed in a dielectric layer 70. In an embodiment of the instant invention the metal contact comprises tungsten, aluminum, or copper and contacts the source or drain of a MOS transistor not shown for clarity. The dielectric layer 70 comprises silicon dioxide, silicon oxide, PSG, BPSG, or any other suitable dielectric layer including low k spin-on-glass (SOG) dielectrics such as silsesquioxanes. In fabricating the ferroelectric memory capacitor according to an embodiment of the instant invention, a barrier layer 200 of titanium nitride or titanium aluminum nitride is first formed over the dielectric layer 70 and the contact 80. Following the formation of the barrier layer 200, a metal electrode layer 210 is formed over the barrier layer 200. The metal electrode layer 210 will form one of the electrodes of the ferroelectric capacitor and in an embodiment of the instant invention can comprise iridium, iridium oxide, or other suitable metal. Following the formation of the metal electrode layer 210, a ferroelectric dielectric layer 220 is formed. In an embodiment the ferroelectric dielectric layer comprises PZT although other ferroelectric materials can be used. Following the formation of the ferroelectric layer 220, a second metal electrode layer 230 is formed over the ferroelectric layer 220. In an embodiment of the instant invention the second metal electrode layer 230 comprises iridium oxide. A third metal electrode layer 240 is formed over the second metal electrode layer 230 and in an embodiment can comprise iridium. Both the second and third metal electrode layers 230 and 240 can be formed in-situ in the same physical vapor deposition (PVD) tool or other suitable deposition tool. In addition, in other embodiments both metal electrode layers 230 and 240 can be replaced by a single metal electrode layer comprising iridium, iridium oxide, or other suitable material. In either case, the metal electrode layers 230 and 240 or the single metal electrode layer will form the other electrode of the ferroelectric capacitor. Following the formation of the metal electrode layers 230 and 240, a hard-mask layer 250 is formed over the metal electrode layers 230 and 240. In an embodiment the hard-mask layer 250 comprises layers of titanium aluminum nitride, titanium aluminum oxynitride, and/or titanium aluminum nitride with small amounts of oxygen (i.e. less than 3 atomic percent of oxygen). Other suitable combinations of materials can be used to form the hardmask layer 250 without departing from the scope of the instant invention. Following the formation of the-hard-mask layer (or layers) 250, a patterned photoresist layer 260 is formed on the hard-mask layer 250.

Using the patterned photoresist layer 260 as a mask, the hard-mask layer 250 is etched and the patterned photoresist layer removed as shown in FIG. 2(b). The hard-mask layer 250 is etched using a chlorine containing plasma etch resulting in the etched hard-mask layer 255. The patterned photoresist layer 260 is removed using an ash process and the entire structure can be cleaned using a wet cleaning process. In an embodiment of the instant invention the wet cleaning process can comprise SC1. Following any necessary wet clean processes, the ferroelectric capacitor structure is etched using a three-step etch process. Each step of the three-step etch process described below takes place at temperatures being between 200° C. and 500° C. and more preferably at 350° C.

In the first step of the etch process, the metal electrode layers 240 and 230 comprising iridium and iridium oxide are etched to form the etched layers 245 and 235 using the following gases in a plasma process:

| Gas | Flow-rate (Sccm) |
|---|---|
| $Cl_2$ | 62–68 |
| $O_2$ | 87–94 |
| $N_2$ | 12–18 |
| CO | 85–96 |

In an embodiment the above process can be performed with a source power of 1200 Watts and/a bias power of 450 Watts.

In the second step of the process, the PZT layer 220 is etched to form the etched layer 225. In an embodiment the PZT layer 220 can be etched in a plasma process comprising $BCl_3$ and $Cl_2$ gases with a source power level of 100 Watts and a bias power level of 450 Watts. In a further embodiment the ratio of $BCl_3$ to $Cl_2$ in the gas mixture during the etching of the PZT layer lies between 1 to 4 (1:4) and 10 to 1 (10:1) respectively. Finally, in yet a further embodiment, the PZT layer is etched using 88 sccm to 93 sccm of $BCl_3$ and 17–23 sccm of $Cl_2$. In a further embodiment the above process can be performed with a source power of 1200 Watts and a bias power of 450 Watts.

In the third step of the process the remaining metal electrode layer 210 is etched to form the etched layer 215. In an embodiment the metal electrode layer 210 can be etched using the following gases in a plasma process:

| Gas | Flow-rate (Sccm) |
|---|---|
| $Cl_2$ | 62–68 |
| $O_2$ | 87–94 |
| $N_2$ | 12–18 |
| CO | 85–96 |

In an embodiment the above process can be performed with a source power of 1200 Watts and a bias power of 300 Watts.

Figure 1:
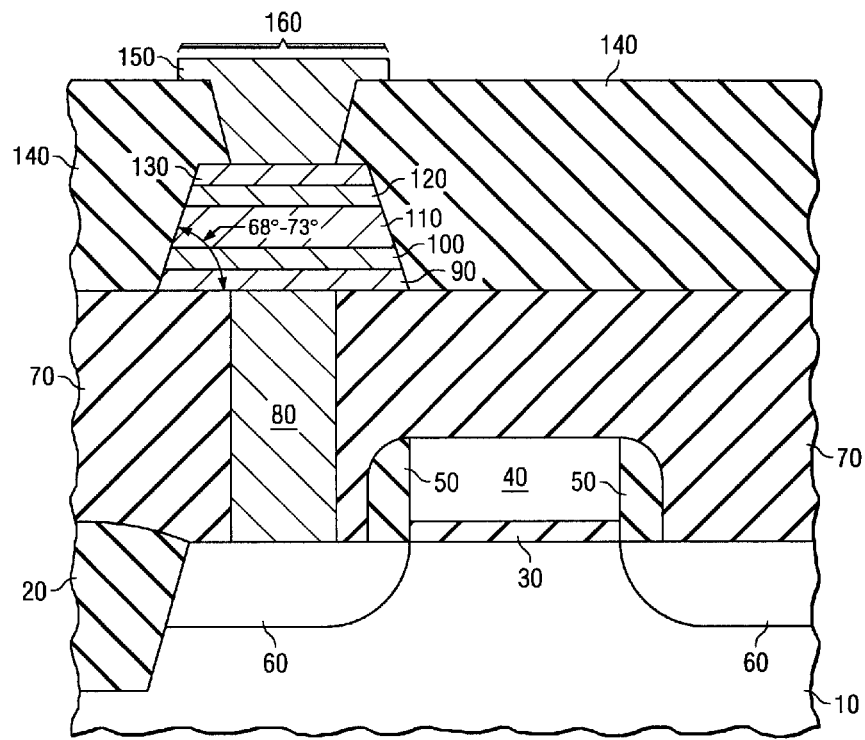
FIG. 1 is a cross-sectional diagram of apportion of a ferroelectric memory cell according to the prior art.

Following the three-step etch process the remaining barrier layer 200 can be etched using a chlorine containing plasma etch process. The resulting structure is shown in FIG. 2(c). In an optional step, the remaining hard-mask layer 255 can be removed before further processing to complete the memory cell. The remaining hard-mask can however be left on the structure to act as a hydrogen barrier. It should be noted that the ferroelectric memory capacitor fabricated according to the present invention 270 has sidewalls with angles between 78° and 88° with the plane of the upper surface of the dielectric layer 70. This should be compared with the sidewall angles of 68° to 73° with the plane of the upper surface of the dielectric layer 70 in the prior art capacitor shown in FIG. 1. The increased sidewall angle leads to an increased integrated circuit packing density for ferroelectric memory circuits formed using memory capacitors of the instant invention.

For ferroelectric capacitor etching processes that involves etching a hard to etch noble metal or noble metal oxide (for example Pt, Pd, Ag, Au, Ir) there is currently a limitation in the etch process of this noble metal material to processes that contain a significant physical etch component. As long as there is a significant physical etch component there will always be a problem in re-deposition of these noble metal components during etching of these materials that lie below the ferroelectric capacitor. The re-deposition of these noble metal components on the sides of the ferroelectric or other high dielectric constant material will result in enhanced leakage and possibly even shorting of the capacitor. This shorting or high leakage might not occur on every capacitor but it only needs to occur on even a few capacitors in an array to cause a significant yield problem in making a memory device or other circuit using these capacitors. Since the etching of these noble materials intrinsically contains at least some physical component there will always be a need to have some sidewall slope even though the ideal etch profile is vertical i.e. 90 degree angle. In addition there exists a need to have very steep slopes in order to make small capacitors with small capacitor spaces. The area efficiency of the capacitor is of course limited by the electrical area of the capacitor and the lithographical limits. Steep capacitors are therefore essential to make small devices. Therefore there must be an optimum sidewall angle in terms of noble metal re-deposition and steepness. In the instant invention the optimum angle is preferred to be approximately 83° with a preferred range of 78° to 88° with a more preferred range of 81° to 85°.

In another preferred embodiment a multi-step etch process is utilized taking advantage of the fact that it is during the etching of the noble metal components that re-deposition occurs. This process starts by etching the noble metal layers below the capacitor while the sidewall angle on the sides of the capacitor dielectric are at a relatively shallow angle compared to the final angle. For example a preferred angle for this initial noble metal etching is 76° with a preferred range of 71° to 80° and a more preferred angle between 73° to 78°. After etching the noble metal layers, the etch process for the noble metals and capacitor dielectric process are changed to steepen the sidewall angle. The steepening process or processes takes advantage of the fact that very little noble metals are being etched and hence even with steeper profiles on the capacitor dielectric the re-deposition of conductive materials will be significantly reduced. After the steepening process the final desired profiles are easier to achieve as described above and the optimum angle is preferred to be approximately 83° with a preferred range of 78° to 86° with a more preferred range of 81° to 85°.

Although the present invention has been described with several embodiments, various-changes and modifications may be suggested to one skilled in the art. It is intended that the present invention encompass such changes and modifications that follow within the scope of the appended claims.

We claim:

1. A method for forming a ferroelectric capacitor comprising:
   providing a dielectric layer over a semiconductor;
   forming a barrier layer over said dielectric layer;
   forming a first metal layer over said barrier layer;
   forming a ferroelectric layer over said first metal layer;
   forming a hard-mask layer over said second metal layer; and
   etching said second metal layer, said ferroelectric layer, and said first metal layer using a three step plasma process comprising:
     a first metal layer etch comprising the gases Cl2, O2, N2, and CO;
     a PZT etch comprising the gases BCl3 and Cl2; and
     a second metal layer etch comprising the gases Cl2, O2, N2, and CO,
   wherein said plasma process comprises a PZT etch process comprising the gases BCl3 and Cl2 in a range of ratios from 1:4 to 10:1 respectively.

2. The method of claim 1 wherein said first metal layer comprises iridium, said ferroelectric layer comprises PZT, and said second metal layer comprises iridium.

3. The method of claim 1 wherein the N2 has a flowrate that is less than the flowrate of CO.

4. The method of claim 1 wherein the Cl2 has a flowrate that is less than the flowrate of CO.

5. The method of claim 1 wherein the N2 has a flowrate that is less than the flowrate of O2.

6. A method for forming a ferroelectric memory cell comprising:
   providing a dielectric layer over a semiconductor;
   forming a barrier layer over said dielectric layer;
   forming a first metal layer over said barrier layer;
   forming a ferroelectric layer over said first metal layer;
   forming a second metal layer over said ferroelectric layer;
   forming a hard-mask layer over said second metal layer;
   etching said first metal layer with a plasma process comprising the gases Cl2, O2, N2, and CO; and
   etching said ferroelectric layer with a plasma process comprising the gases BCl3 and Cl2, wherein said ferroelectric layer etch process further comprises the gases BCl3 and Cl2 in a range of ratios from 1:4 to 10:1 respectively.

7. The method of claim 6 wherein all etch process are performed at temperatures between 200° C. and 500° C.

8. The method of claim 7 wherein all etch process are performed at temperatures greater than 200° C. and less than 250° C.

9. The method of claim 7 wherein all etch process are performed at temperatures greater than about 450° C. and less than 500° C.

10. The method of claim 6 wherein said first metal layer comprises iridium and said ferroelectric layer comprises PZT.

11. The method of claim 6 wherein the N2 has a flowrate that is less than the flowrate of CO.

12. The method of claim 6 wherein the Cl2 has a flowrate that is less than the flowrate of CO.

* * * * *